(12) United States Patent
Hirano

(10) Patent No.: US 7,372,314 B2
(45) Date of Patent: May 13, 2008

(54) VOLTAGE LEVEL CONVERSION CIRCUIT

(75) Inventor: Hiroshige Hirano, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 6 days.

(21) Appl. No.: 11/132,272

(22) Filed: May 19, 2005

(65) Prior Publication Data

US 2005/0258886 A1   Nov. 24, 2005

(30) Foreign Application Priority Data

May 21, 2004   (JP) ............................. 2004-152495

(51) Int. Cl.
*H03L 5/00*   (2006.01)
(52) U.S. Cl. ........................ 327/333; 326/81
(58) Field of Classification Search ................ 327/306, 327/333, 437; 326/81, 62
See application file for complete search history.

(56) References Cited

U.S. PATENT DOCUMENTS 6,236,256 B1 *   5/2001   Brownlow et al. ......... 327/333
6,384,808 B2 *   5/2002   Azami ......................... 345/100
6,501,301 B2 *  12/2002   Taguchi ....................... 326/101
6,566,932 B2 *   5/2003   Yoon ........................... 327/333
6,717,453 B2 *   4/2004   Aoki ........................... 327/333
6,809,554 B2 *  10/2004   Wada ........................... 326/81

FOREIGN PATENT DOCUMENTS

JP         5-14174        1/1993

* cited by examiner

*Primary Examiner*—Dinh T. Le
(74) *Attorney, Agent, or Firm*—Wenderoth, Lind & Ponack, L.L.P.

(57) ABSTRACT

A voltage level conversion circuit is provided with a level converter for converting a VDD1 system input signal into a VDD2 system signal, and a NOT circuit for inverting the level-converted input signal and outputting the inverted signal, and the outputs of VDD1 system NOT circuits constituting the level converter are input to only high breakdown voltage transistors in the level converter while a signal having a logical voltage level corresponding to the low power supply voltage VDD2 is input to low breakdown voltage transistors, and further, only the input signal level-converted by the level converter is input to the NOT circuit.

5 Claims, 7 Drawing Sheets

Fig.7 Priror Art
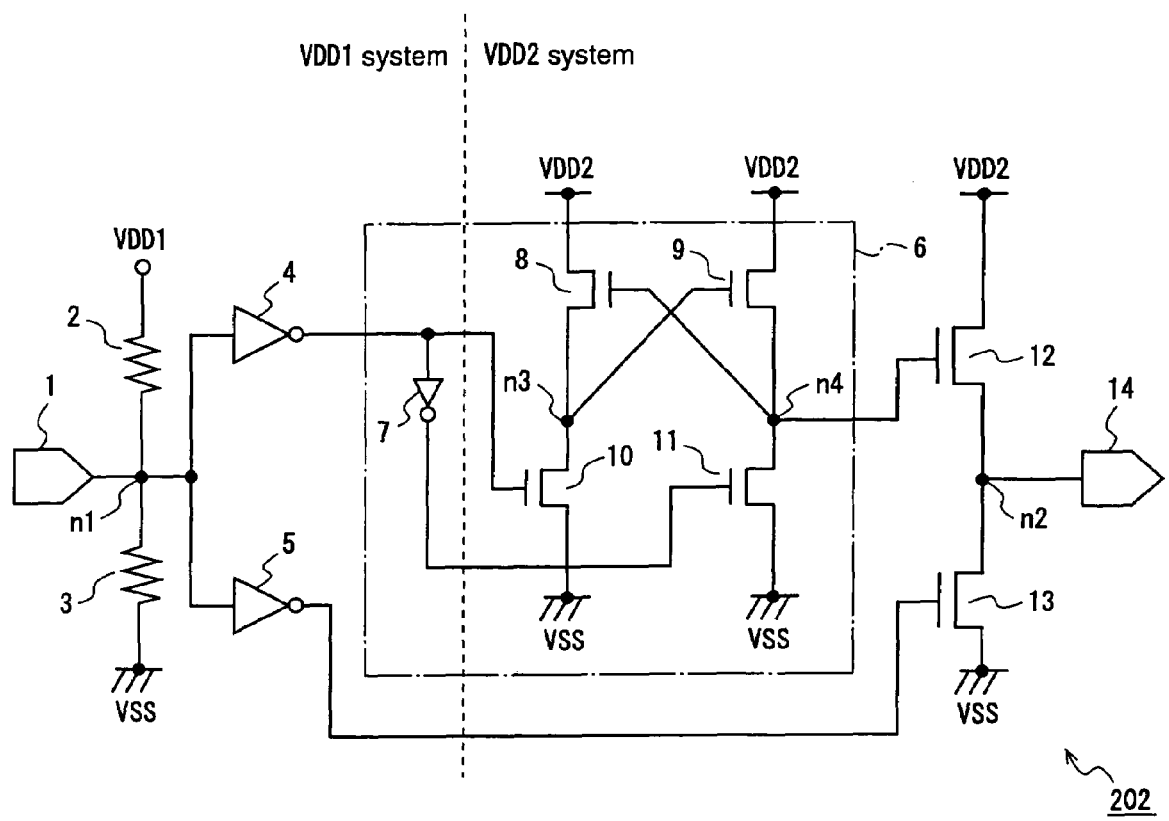
202

VOLTAGE LEVEL CONVERSION CIRCUIT

FIELD OF THE INVENTION

The present invention relates to a voltage level conversion circuit and, more particularly, to a voltage level conversion circuit for converting an input signal having a logical voltage level corresponding to a first power supply voltage into an output signal having a logical voltage level corresponding to a second power supply voltage that is lower than the first power supply voltage.

BACKGROUND OF THE INVENTION

In recent years, with miniaturization of semiconductor devices, two kinds of voltages, i.e., an external voltage and an internal voltage, are used and the internal voltage is set lower than the external voltage. Therefore, there is a request for a circuit for converting the logical voltage level of a signal between a circuit driven by the external voltage and a circuit driven by the internal voltage.

Hereinafter, a description will be given of prior arts with respect to a circuit for converting a logical voltage level corresponding to a high power supply voltage to a logical voltage level corresponding to a low power supply voltage (hereinafter referred to as "voltage level conversion circuit").

Generally, as shown in FIG. 6, the conventional voltage level conversion circuit for converting a logical voltage level corresponding to a high power supply voltage into a logical voltage level corresponding to a low power supply voltage is composed of two stages of NOT circuits.

With reference to FIG. 6, the voltage level conversion circuit 201 comprises a front-stage NOT circuit 201a which is driven by a high power supply voltage VDD1 and inverts an input signal IN, and a rear-stage NOT circuit 201b which is driven by a low power supply voltage VDD2 and inverts an output signal OUT1 of the NOT circuit 201a.

The front-stage NOT circuit 201a comprises a P channel MOS transistor Qhp11 and an N channel MOS transistor Qhn11 which are connected in series between the high power supply voltage VDD1 and a ground voltage VSS, and a gate of the power supply side transistor Ohp11 and a gate of the ground side transistor Qhn11 are commonly connected. In the NOT circuit 201a, a common connection node of the gates is an input node N1a to which the input signal IN is applied, and a connection point of the power supply side transistor Qhp11 and the ground side transistor Qhn11 is an output node N1b.

The rear-stage NOT circuit 201b comprises a P channel MOS transistor Qhp12 and an N channel MOS transistor Qhn12 which are connected in series between the low power supply voltage VDD2 and the ground voltage VSS, and a gate of the power supply side transistor Qhp12 and a gate of the ground side transistor Qhn12 are commonly connected. In the NOT circuit 201b, a common connection node of the gates is an input node N2a to which the output signal OUT1 of the front-stage NOT circuit 201a is applied, and a connection node of the power supply side transistor Qhp12 and the ground side transistor Qhn12 is an output node N2b.

In the above-mentioned voltage level conversion circuit 201, when the input signal IN is supplied, the front-stage NOT circuit 201a inverts the input signal IN and outputs the signal to the rear-stage NOT circuit 201b. Then, the rear-stage NOT circuit 201b further inverts the inverted input signal and outputs the signal.

At this time, since the power supply voltage VDD2 of the rear-stage NOT circuit 201b is lower than the power supply voltage VDD1 of the front-stage NOT circuit 201a, the logical voltage level of the output signal OUT of the rear-stage NOT circuit 201b is lower than the logical voltage level of the output signal OUT1 of the front-stage NOT circuit 201a, whereby the logical voltage level of the input signal is converted from the logical voltage level corresponding to the high voltage power supply to the logical voltage level corresponding to the low power supply voltage.

In the voltage level conversion circuit 201 which converts the logical voltage level of the input signal using the two stages of NOT circuits as described above, generally, the respective NOT circuits 201a and 201b are constituted by VDD1 breakdown voltage transistors having the high power supply voltage as their breakdown voltages, and the rear-stage NOT circuit 201b is driven with the power supply voltage VDD2 which is lower than the power supply voltage VDD1 for driving the front-stage NOT circuit 201a, and the circuit construction thereof is simple.

In the voltage level conversion circuit 201 comprising the two stages of NOT circuits, however, since the threshold values of the VDD1 breakdown voltage transistors constituting the NOT circuits are set at high values, it is difficult to operate the rear-stage NOT circuit 201b with a power supply voltage that is lower than the threshold voltage of the VDD1 breakdown voltage transistor. Although it becomes possible to operate the rear-stage NOT circuit 201b with a power supply voltage that is lower than the threshold voltage of the VDD1 breakdown voltage transistor by using low-threshold-voltage transistors as the transistors constituting the rear-stage NOT circuit 201b. In this case, however, the breakdown voltage of the transistors constituting the rear-stage NOT circuit 201b is lowered, which brings about the possibility of circuit breakage.

Meanwhile, Japanese Published Patent Application No. Hei. 5-14174 (patent literature 1) discloses a level shifter circuit which is able to perform conversion of three values of input and output including high impedance input and output.

FIG. 7 is a diagram for explaining the level shifter circuit disclosed in the patent literature 1.

The level shifter circuit 202 is a circuit for converting the level of an input signal applied to an input terminal 1, and outputting the signal from an output terminal 14.

With reference to FIG. 7, the level shifter circuit 202 comprises a first resistor 2 and a second resistor 3 which are connected in series between a power supply voltage VDD1 and a ground voltage VSS; first and second inverters 4 and 5 having input nodes connected to a connection node n1 of the first and second resistors, respectively; and a level shifter 6 for converting the level of the output of the first inverter 4. The second inverter 5 has a threshold value lower than that of the first inverter 4. Further, the level shifter circuit 202 includes a P channel MOS transistor 12 and an N channel MOS transistor 13 which are connected in series between a power supply voltage VDD2 and the ground voltage VSS, and an output node of the level shifter 6 is connected to a gate of the power supply side transistor 12 while an output node of the inverter 5 is connected to a gate of the ground side transistor 13. An input terminal 1 of the level shifter circuit 202 is connected to a connection node n1 of the first resistor 2 and the second resistor 3, and an output terminal 14 thereof is connected to a connection node n2 of the transistors 12 and 13.

The level shifter 6 includes an inverter 7 to which an output signal of the inverter 4 is applied; a first P channel MOS transistor 8 and a first N channel MOS transistor 10 which are connected in series between the power supply voltage VDD2 and the ground voltage VSS; and a second P channel MOS transistor 9 and a second N channel MOS transistor 11 which are connected in series between the power supply voltage VDD2 and the ground voltage VSS. A connection node n3 of the transistor 8 and the transistor 10 is connected to a gate of the transistor 9, and a connection node n4 of the transistor 9 and the transistor 11 is connected to a gate of the transistor 8. This level shifter 6 converts a VDD1 system signal which is outputted from the inverter 4 and has a logical voltage level corresponding to the high power supply voltage VDD1 into a VDD2 system signal having a logical voltage level corresponding to the low power supply voltage VDD2.

Next, the operation of the level shifter circuit 202 will be described in brief.

In the level shifter circuit 202, when the input voltage applied to the input terminal 1 is low level, the output voltage of the inverter 4 is high level and the output voltage of the inverter 5 is approximately high level. At this time, the output voltage of the inverter 4 is converted from the high level logical voltage of the VDD1 system signal into the high level logical voltage of the VDD2 system signal. Accordingly, the gate voltage VGP of the P channel transistor 12 becomes the low power supply voltage VDD2 while the gate voltage VGN of the N channel transistor 13 becomes the high power supply voltage VDD1, whereby the low level logical voltage (ground voltage) VSS is output from the output terminal 14.

On the other hand, when the voltage applied to the input terminal 1 is high level, the output of the inverter 4 is approximately low level and the output of the inverter 5 is low level. When the output voltage of the inverter 4 is approximately low level, the low level logical voltage remains at the ground voltage even when the output voltage of the inverter 4 is converted by the level shifter 6. Accordingly, the gate voltage VGP of the P channel transistor 12 becomes the ground voltage VSS, and the gate voltage VGN of the N channel transistor 13 becomes the ground voltage VSS, whereby the high level logical voltage VDD2 of the VDD2 system signal is output from the output terminal 14.

Further, when the input voltage applied to the input terminal 1 is an intermediate level between the high level and the low level, the output voltage of the inverter 4 is high level and the output voltage of the inverter 5 is approximately low level. At this time, the output voltage of the inverter 4 is converted by the level shifter 6 from the high level logical voltage of the VDD1 system signal to the high level logical voltage of the VDD2 system signal. Accordingly, the gate voltage VGP of the P channel transistor 12 becomes the low power supply voltage VDD2 and the gate voltage VGN of the N channel transistor 13 becomes the ground voltage VSS. That is, at this time, both of the power supply side transistor 12 and the ground side transistor 13 are in the off states, and the output terminal 14 is in the high-impedance state.

This literature has no specific description about the power supply voltage VDD1 and the power supply voltage VDD2 of the level shifter circuit 202. However, like the voltage level conversion circuit 201 shown in FIG. 6, when the power supply voltage VDD2 is lower than the power supply voltage VDD1, the inverter 5 is driven by the high power supply voltage VDD1, and the high level logical voltage or low level logical voltage of the VDD1 system signal is applied to the gate of the transistor 13, and therefore, the transistor 13 needs a modification such as an increase in the thickness of a gate oxide film so as to have the same breakdown voltage as that of the transistors which constitute the circuit driven by the high power supply voltage VDD1 (VDD1 system circuit). In this case, however, the transistor 13 with the thickness of the gate oxide film being increased is included in the circuit subsequent to the level shifter 6, which is driven by the low power supply voltage VDD2. Therefore, the low power supply voltage VDD2 cannot be set at a value that is lower than the threshold value of the transistor 13, i.e., the threshold value of the transistors of the VDD1 system circuit.

Therefore, in contrast to the voltage level conversion circuit shown in FIG. 6, the level shifter circuit 202 disclosed in literature 1 is a voltage level conversion circuit in which the power supply voltage VDD2 is higher than the power supply voltage VDD1, i.e., which converts the logical voltage level corresponding to the low power supply voltage into the logical voltage level corresponding to the high power supply voltage.

As described above, in the conventional voltage level conversion circuit 201 comprising the two stages of NOT circuits shown in FIG. 6, since the rear-stage NOT circuit having the low power supply voltage VDD2 as a power supply voltage is constituted by the VDD1 breakdown voltage (high breakdown voltage) system transistors, the threshold voltage of the transistors is high, and it is difficult to operate the high breakdown voltage transistors with the low power supply voltage that is lower than the threshold voltage. Therefore, the voltage level conversion circuit 201 impedes reduction in power consumption by low voltage driving and miniaturization of transistors in the semiconductor device.

Further, as described above, the level shifter circuit 202 shown in FIG. 7 is regarded as a circuit for converting a logical voltage level corresponding to a low power supply voltage into a logical voltage level corresponding to a high power supply voltage. When the circuit construction of the level shifter circuit 202 is applied to a voltage level conversion circuit for converting a logical voltage level corresponding to a high power supply voltage into a logical voltage level corresponding to a low power supply voltage, the transistor 13 to which the logical voltage corresponding to the high power supply voltage is applied comes to have a high breakdown voltage with a thick gate oxide film, and thereby the low power supply voltage cannot be lower than the threshold value of the transistor having the high power supply voltage as a breakdown voltage.

SUMMARY OF THE INVENTION

The present invention is made to solve the above-described problems and has for its object to provide a voltage level conversion circuit which is operable with a lower internal voltage, and converts a logical voltage level of an input signal from a logical voltage level corresponding to a high power supply voltage into a logical voltage level corresponding to a low power supply voltage.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a voltage level conversion circuit for converting an input signal having a logical voltage level corresponding to a first power supply voltage into an output signal having a logical voltage level corresponding to a second power supply voltage that is lower than the first power supply voltage, wherein a first P channel MOS transistor having the second power supply voltage as a breakdown voltage and a first N channel MOS transistor having the first power supply voltage as a breakdown voltage are connected in series between the second power supply voltage and a ground voltage; a second P channel MOS transistor having the second power supply voltage as a breakdown voltage and a second N channel MOS transistor having the first power supply voltage as a breakdown voltage are connected in series between the second power supply voltage and the ground voltage; a first connection node of the first P channel MOS transistor and the first N channel MOS transistor is connected to a gate of the second P channel MOS transistor; a second connection node of the second P channel MOS transistor and the second N channel MOS transistor is connected to a gate of the first P channel MOS transistor; and the output signal is supplied from the second connection node to a circuit that is driven by the second power supply voltage. In this first aspect, the voltage level conversion circuit for converting the logical voltage level of an input signal is provided with a level converter which is driven by a low power supply voltage and converts the input signal having a logical voltage level corresponding to a high power supply voltage into an output signal having a logical voltage level corresponding to the low power supply voltage, and the output signal which is obtained by level-shifting the input signal by the level converter is supplied to a circuit driven by the low power supply voltage. Therefore, transistors having breakdown voltages equal to the low power supply voltage can be used as the transistors constituting the circuit in the rear stage of the level converter. Thereby, it is possible to set the low power supply voltage of the level converter at a value lower than the threshold value of the transistor having a breakdown voltage equal to the high power supply voltage, resulting in a voltage level conversion circuit that can be operated by a lower internal voltage.

According to a second aspect of the present invention, in the voltage level conversion circuit according to the first aspect, the driving abilities of the first P channel MOS transistor and the second P channel MOS transistor are smaller than the driving abilities of the first N channel MOS transistor and the second N channel MOS transistor. In this second aspect, since the driving abilities of the first P channel MOS-transistor and the second P channel MOS transistor are set to values smaller than the driving abilities of the first N channel MOS transistor and the second N channel MOS transistor, it is possible to speed up the operation of the level converter when the N channel MOS transistors are in their on states.

According to a third aspect of the present invention, the voltage level conversion circuit according to the first aspect further includes a NOT circuit which is constituted by a third P channel MOS transistor having the second power supply voltage as a breakdown voltage and a third N channel MOS transistor having the second power supply voltage as a breakdown voltage, the driving ability of the third N channel MOS transistor being smaller than the driving ability of the third P channel MOS transistor, and the output signal is supplied through the NOT circuit to the circuit driven by the second power supply voltage. In this third aspect, there is provided the NOT circuit which is constituted by the third P channel MOS transistor and the third N channel MOS transistor having a driving ability lower than that of the third P channel MOS transistor, and the output signal is supplied through the NOT circuit to the circuit driven by the second power supply voltage. Therefore, the NOT circuit in the rear stage of the level converter can compensate for the driving ability of the N channel MOS transistor being lower than the driving ability of the P channel MOS transistor in the level converter, whereby the operation speed of the voltage level conversion circuit as a whole can be further increased.

According to a fourth aspect of the present invention, in the voltage level conversion circuit according to the first aspect, a first resistor is inserted between the first P channel MOS transistor and the first N channel MOS transistor; and a second resistor is inserted between the second P channel MOS transistor and the second N channel MOS transistor. In this fourth aspect, since the resistors are connected in series to the respective P channel MOS transistors constituting the level converter to suppress the driving abilities of transistors, the driving efficiencies of the N channel transistors constituting the level converter are substantially enhanced, whereby the operation of the level converter can be speeded up when the N channel MOS transistors are in their on states.

According to a fifth aspect of the present invention, the voltage level conversion circuit according to the first aspect comprises a fifth P channel MOS transistor connected between the first connection node and the second power supply voltage; a sixth P channel MOS transistor connected between the second connection node and the second power supply voltage; a first signal generation circuit for applying a one-shot pulse voltage for turning on the sixth P channel MOS transistor to a gate of the sixth P channel MOS transistor, when an L level logical voltage generated at the first connection node is detected; and a second signal generation circuit for applying a one-shot pulse voltage for turning on the fifth P channel MOS transistor to a gate of the fifth P channel MOS transistor, when an L level logical voltage generated at the second connection node is detected. In this fifth aspect, since there are provided the auxiliary P channel MOS transistors for supporting the operations of the P channel MOS transistors in the level converter and the auxiliary P channel MOS transistors are driven by the one-shot pulses, respectively, the voltage level conversion circuit can be operated at higher speed with more stability.

BRIEF DESCRIPTION OF THE DRAWINGS

FIG. 7 is a diagram for explaining the level shift circuit described in literature 1.

PREFERRED EMBODIMENTS OF THE PRESENT INVENTION

Hereinafter, preferred embodiments of the present invention will be described.

Embodiment 1

Figure 1:
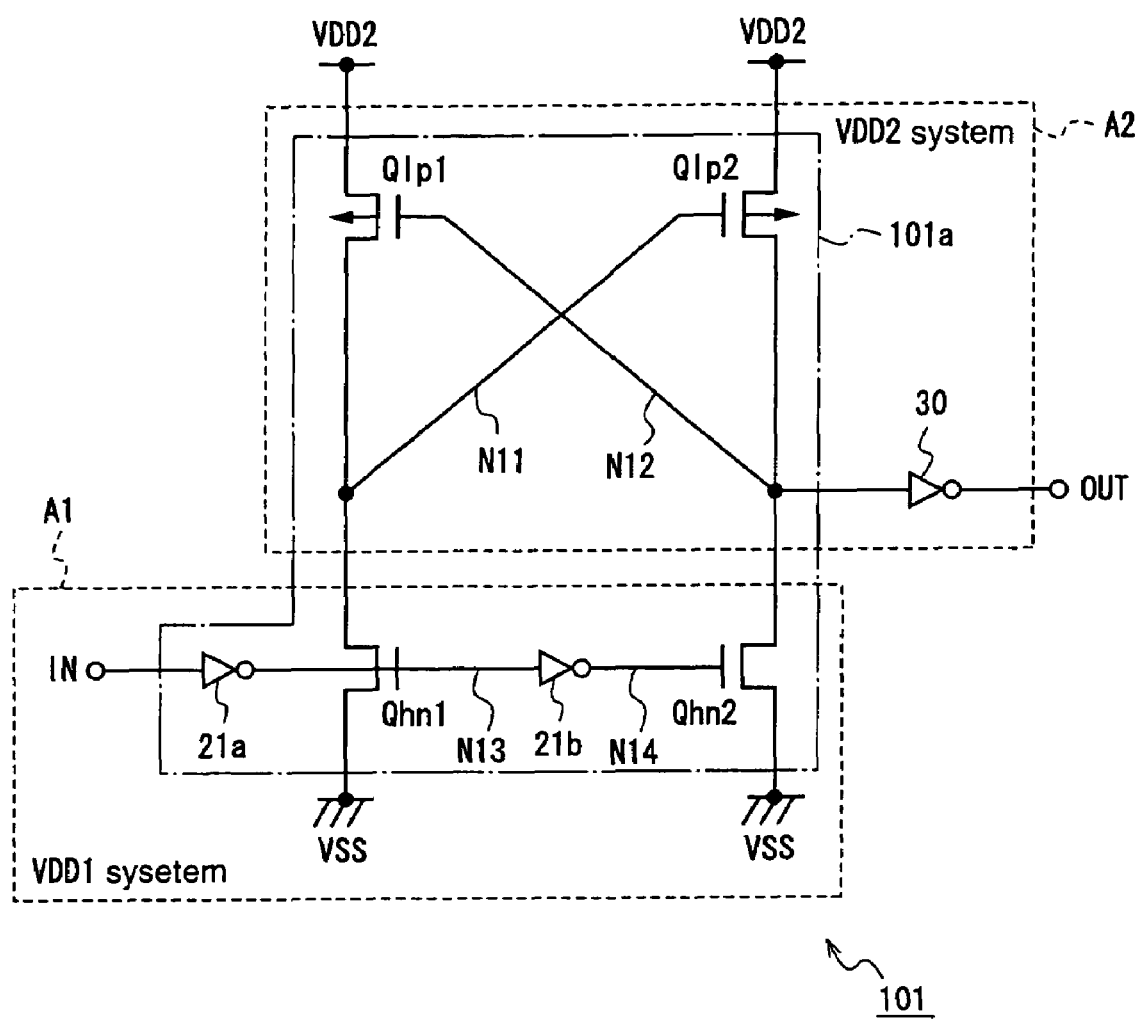
FIG. 1 is a diagram for explaining a voltage level conversion circuit according to a first embodiment of the present invention.

FIG. 1 is a circuit diagram for explaining a voltage level conversion circuit 101 according to a first embodiment of the present invention.

The voltage level conversion circuit 101 according to the first embodiment is a circuit for converting an input signal having a logical voltage level of a high power supply voltage system (VDD1 system) into an output signal having a logical voltage level of a low power supply voltage system (VDD2 system). The voltage level conversion circuit 101 includes a level converter which comprises a high breakdown voltage N channel MOS transistor and a low breakdown voltage P channel MOS transistor having a threshold value lower than that of the N channel MOS transistor, wherein the VDD1 system input signal is input to only the gate of the high breakdown voltage N channel MOS transistor, and the level converter outputs the input signal that is level-converted by the level converter to a circuit that is driven by the low power supply voltage, whereby the VDD2 system power supply voltage is reduced.

With reference to FIG. 1, the voltage level conversion circuit 101 includes a level converter 101a for converting the VDD1 system input signal into the VDD2 system signal; and a NOT circuit 30 for inverting the level-converted input signal and outputting the inverted signal. Reference numeral 21a denotes a first NOT circuit for inverting an input signal IN, and numeral 21b denotes a second NOT circuit for inverting the output signal of the first NOT circuit 21a. Further, a first P channel MOS transistor Qlp1 having the low power supply voltage VDD2 as a breakdown voltage and a first N channel MOS transistor Qhn1 having the high power supply voltage VDD1 as a breakdown voltage are connected in series between the low power supply voltage VDD2 as the second power supply voltage and the ground voltage VSS, and a second P channel MOS transistor Qlp2 having the low power supply voltage VDD2 as a breakdown voltage and a second N channel MOS transistor Qhn2 having the high power supply voltage VDD1 as a breakdown voltage are connected in series between the low power supply voltage VDD2 as the second power supply voltage and the ground voltage VSS. A connection node N11 of the P channel MOS transistor Qlp1 and the N channel MOS transistor Qhn1 is connected to the gate of the P channel MOS transistor Qlp2, and a connection node N12 of the P channel MOS transistor Qlp2 and the N channel MOS transistor Qhn2 is connected to the gate of the P channel MOS transistor Qlp1. A node N13 is an output node of the NOT circuit 21a, and it is connected to the gate of the N channel MOS transistor Qhn1 and to an input node of the NOT circuit 21b. Further, a node N14 is an output node of the NOT circuit 21b, and it is connected to the gate of the N channel MOS transistor Qhn2.

The voltage level conversion circuit 101 converts the level of the input signal IN inputted to the input node of the NOT circuit 21a, and outputs the level-converted input signal to the circuit driven by the low power supply voltage VDD2 through the connection node N12 of the P channel MOS transistor Qlp2 and the N channel MOS transistor Qhn2.

The first P channel MOS transistor Qlp1, the second P channel MOS transistor Qlp2, and the MOS transistor constituting the NOT circuit 30 are low breakdown voltage transistors having a low threshold value, and these transistors belong to the circuit system A2 driven by the low power supply voltage VDD2 (VDD2 system). On the other hand, the first N channel MOS transistor Qhn1, the second N channel MOS transistor Qhn2, and the MOS transistors (not shown) constituting the inverters 21a and 21b are high breakdown voltage transistors having a high threshold value, and these transistors belong to the circuit system A1 driven by the high power supply voltage VDD1 (VDD1 system).

Next, the operation will be described.

When the VDD1 system input signal IN is input to the voltage level conversion circuit 101, the input signal IN is inverted by the NOT circuit 21a, and a NOT signal of the input signal IN is input to the gate of the first N channel MOS transistor Qhn1 and to the NOT circuit 21b. The NOT signal of the input signal IN is inverted by the NOT circuit 21b and inputted to the gate of the second N channel MOS transistor Qhn2.

For example, when the voltage of the input signal IN is an L level logical voltage (=VSS), the gate voltage of the first N channel transistor Qhn1 becomes the H level logical voltage (=VDD1) while the gate voltage of the second N channel transistor Qhn2 becomes the L level logical voltage (=VSS), and the N channel transistor Qhn1 is turned on while the N channel transistor Qhn2 is turned off. Then, the voltage at the first connection node N11 becomes the L level logical voltage (=VSS), whereby the second P channel MOS transistor Qlp2 is turned on, and the voltage at the second connection node N12 becomes the H level logical voltage (=VDD2). Since the voltage at the second connection node N12 becomes the gate voltage of the first P channel MOS transistor Qlp1, the transistor Qlp1 is in the off state, and the voltage at the first connection node N11 is decided at the L level logical voltage (=VSS).

On the other hand, when the voltage of the input signal IN is the H level logical voltage (=VDD1), the first P channel transistor Qlp1 and the second N channel transistor Qhn2 are turned on while the second P channel transistor Qhp2 and the first N channel transistor Qhn1 are turned off, whereby the voltage at the first connection node N11 becomes the H level logical voltage (=VDD2) while the voltage at the second connection node N12 becomes the L level logical voltage (=VSS).

Then, the logical voltage of the second connection node N12 is inverted by the NOT circuit 30 that is driven by the low power supply voltage VDD2, and the inverted output of the NOT circuit 30 is output to the VDD2 system circuit as an output signal OUT of the voltage level conversion circuit 101.

As described above, in the voltage level conversion circuit 101 according to the first embodiment, the outputs of the VDD1 system NOT circuits 21a and 21b are input to only the high breakdown voltage transistors Qhn1 and Qhn2 while the signal having the logical voltage level corresponding to the low power supply voltage VDD2 is input to the low breakdown voltage transistors Qlp1 and Qlp2 having the low power supply voltage VDD2 as a power supply voltage, and low breakdown voltage transistors having a low threshold value are used as the transistors Qlp1 and Qlp2 having the low power supply voltage as a power supply voltage, and further, only the input signal that is level-converted by the level converter 101a is input to the rear-stage NOT circuit 30 of the level converter 101a. Therefore, a low breakdown voltage transistor having a low threshold value can be used as a transistor constituting the NOT circuit 30. Thereby, the low power supply voltage VDD2 as the VDD2 system power supply voltage can be made lower than the threshold value of the VDD1 system high breakdown voltage transistor, resulting in further reduction in the low power supply voltage VDD2.

Furthermore, in the above-mentioned first embodiment, by setting the driving abilities of the first and second P channel MOS transistors Qlp1 and Qlp2 at values smaller than the driving abilities of the first and second N channel MOS transistors Qhn1 and Qhn2, respectively, the amount of charges that flow into the connection node N11 or N12 from the P channel MOS transistor Qlp1 or Qlp2 can be reduced when the N channel MOS transistor Qhn1 or Qhn2 is turned on and electric charges are drawn from the connection node N11 or N12 by the N channel MOS transistor Qhn1 or Qhn2, whereby the voltage level conversion circuit can be operated at higher speed when the N channel MOS transistors Qhn1 and Qhn2 are in their on states.

Embodiment 2

Figure 2:
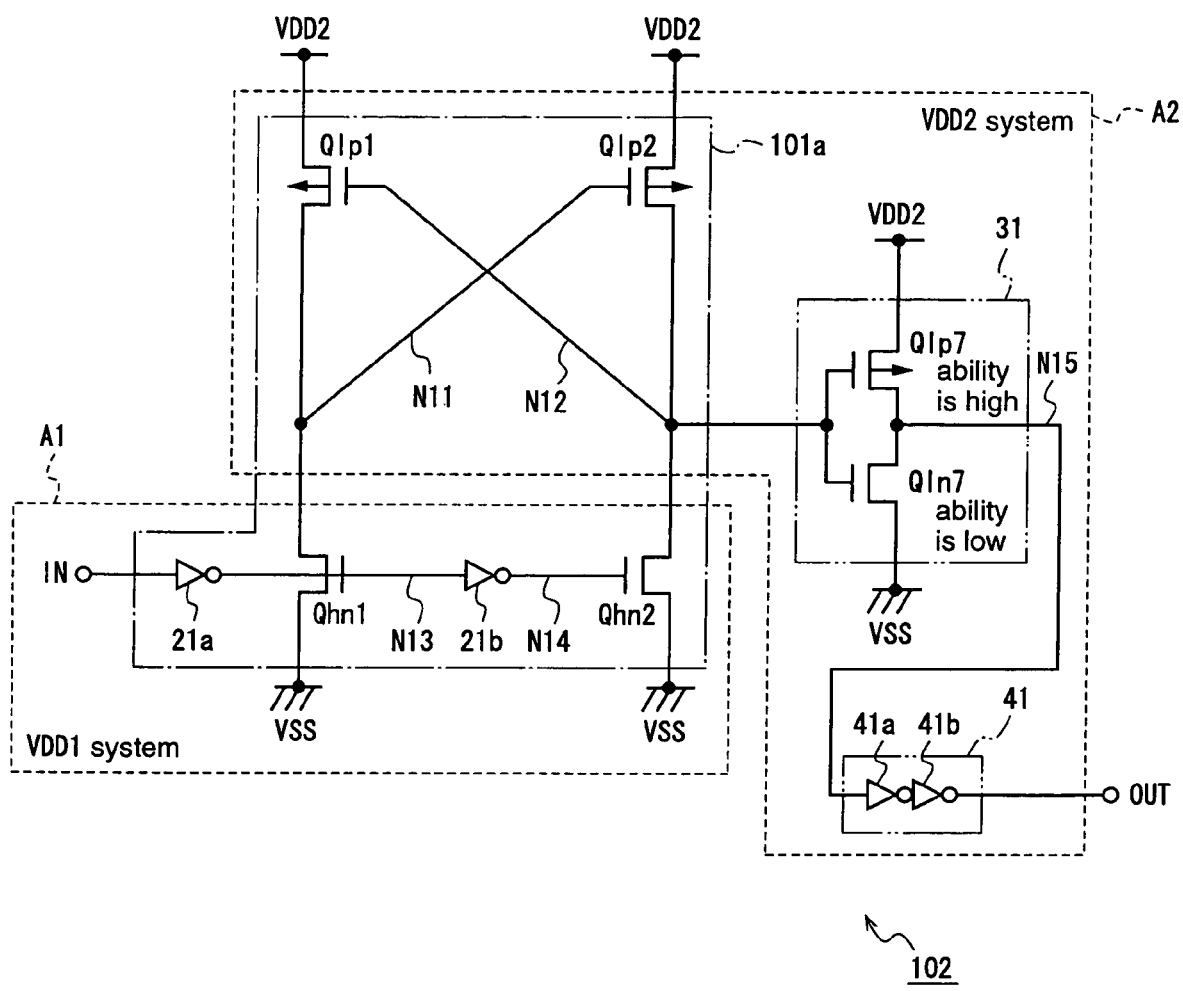
FIG. 2 is a diagram for explaining a voltage level conversion circuit according to a second embodiment of the present invention.

FIG. 2 is a circuit diagram for explaining a voltage level conversion circuit according to a second embodiment of the present invention.

A voltage level conversion circuit 102 according to the second embodiment is provided with, instead of the NOT circuit 30 of the voltage level conversion circuit according to the first embodiment, a NOT circuit 31 for adjusting the balance of transistor performance in a level converter 101a, and an output signal from the NOT circuit 31 is output through an output circuit 41 for waveform shaping.

In FIG. 2, the voltage level conversion circuit 102 includes a level converter 101a of the same construction as that according to the first embodiment, a NOT circuit 31 for inverting a signal outputted from the level converter 101a, and an output circuit 41 for shaping the waveform of a NOT signal outputted from the NOT circuit 31 and outputting the signal. The NOT circuit 31 comprises a third P channel MOS transistor Qlp7 and a third N channel MOS transistor Qln7 which are connected in series between the high-low power supply voltage VDD2 and the ground voltage VSS, and the gate of the power supply side transistor Qlp7 and the gate of the ground side transistor Qln7 are commonly connected to a second connection node N12 of the level converter 101a. As for the ratio of the driving abilities of the third P channel MOS transistor Qlp7 and the third N channel MOS transistor Qln7, the driving ability of the P channel MOS transistor is larger than the driving ability of the N channel MOS transistor so that the level of the output signal OUT changes at high speed when the voltage at the connection node N12 changes from an H level logical voltage to a L level logical voltage.

Further, the output circuit 41 has, as an input node, a connection node N15 of the two MOS transistors Qlp7 and Qln7 which are connected in series and constitute the NOT circuit 31, and comprises two stages of NOT circuits 41a and 41b.

The transistors Qlp7 and Qln7 constituting the NOT circuit 31 and the transistors (not shown) constituting the two stages of NOT circuits 41a and 41b of the output circuit 41 are low breakdown voltage transistors having a low threshold value, and these transistors belong to a VDD2 system A2 which is driven by the low power supply voltage VDD2, as well as the first P channel MOS transistor Qlp1 and the second P channel MOS transistor Qlp2.

Next, the operation will be described.

The operation of the level converter 101a of the voltage level conversion circuit 102 according to the second embodiment is identical to that of the first embodiment, and the input signal IN that is level-converted by the level converter 101a is output to the NOT circuit 31 from the second connection node N12 of the level converter 101a.

In the NOT circuit 31, since the driving ability of the power supply side P channel MOS transistor Qlp7 is larger than the driving ability of the ground side N channel MOS transistor Qln7, when the voltage at the connection node N12 changes from the H level logical voltage to the L level logical voltage, the voltage at the output node N15 changes at high speed.

That is, since a VDD1 system high breakdown voltage transistor is used for the N channel MOS transistor Qhn2, the driving ability of this transistor Qhn2 is generally low, and therefore, the operation of changing the voltage level at the connection node N12 from the H level to the L level is slow. In this second embodiment, reduction in the operation speed of the whole voltage level conversion circuit due to the low driving ability of the VDD1 system transistor can be offset by increasing the driving ability of the P channel MOS transistor Qln7 constituting the next-stage NOT circuit of the level converter 101a, resulting in high-speed operation of the voltage level conversion circuit.

As described above, in the voltage level conversion circuit 102 according to the second embodiment, as in the first embodiment, the VDD1 system signal having the logical voltage level corresponding to the high power supply voltage VDD1 is input to only the high breakdown voltage transistors Qhn1 and Qhn2 while the VDD2 system signal having the logical voltage level corresponding to the low power supply voltage VDD2 is input to the low breakdown voltage transistors Qlp1 and Qlp2, and low breakdown voltage transistors having a low threshold value are used as the transistors Qlp1 and Qlp2 having the low power supply voltage VDD2 as a power supply voltage, and further, only the VDD2 system signal that is level-converted by the level converter 101a is input to the rear-stage NOT circuit 31 of the level converter 101a, and therefore, a low breakdown voltage transistor having a low threshold value can be used as the transistor constituting the NOT circuit 31. Thereby, the low power supply voltage VDD2 as the VDD2 system power supply voltage can be made lower than the threshold value of the VDD1 system high breakdown voltage transistor, resulting in further reduction in the low power supply voltage VDD2.

Further, the driving ability of the power supply side P channel MOS transistor is set to a larger value between the P channel MOS transistor and the N channel MOS transistor constituting the NOT circuit 31. Therefore, the low driving ability and the low-speed operation of the VDD1 system N channel MOS transistor Qhn2 in the level converter 101a can be compensated by the rear-stage NOT circuit 31 of the level converter 101a, resulting in high-speed operation of the whole voltage level conversion circuit.

Embodiment 3

Figure 3:
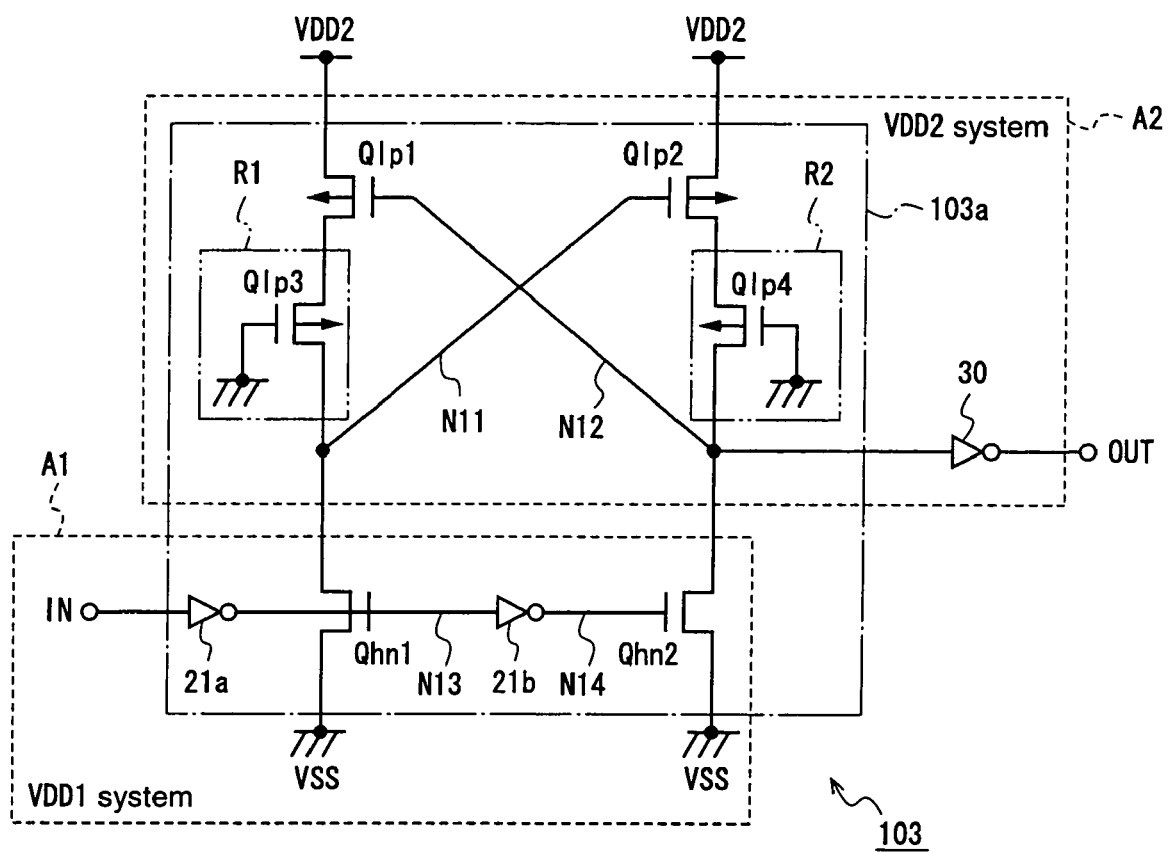
FIG. 3 is a diagram for explaining a voltage level conversion circuit according to a third embodiment of the present invention.

FIG. 3 is a circuit diagram for explaining a voltage level conversion circuit according to a third embodiment of the present invention.

A voltage level conversion circuit 103 according to the third embodiment is provided with a level converter 103a instead of the level converter 101a of the voltage level conversion circuit according to the first embodiment.

The level converter 103a of the voltage level conversion circuit according to the third embodiment is constructed by inserting a resistor R1 between the first connection node N11 and the first P channel MOS transistor Qlp1 in the level converter 101a according to the first embodiment, and inserting a resistor R2 between the second connection node N12 and the second P channel MOS transistor Qlp2 in the level converter 101a.

The resistor R1 comprises a P channel MOS transistor Qlp3 which is connected in series between the first connection node N11 and the first P channel MOS transistor Qlp1, and has a gate connected to the ground voltage VSS. Further, the resistor R2 comprises a P channel MOS transistor Qlp4 which is connected in series between the second connection node N12 and the second P channel MOS transistor Qlp2, and has a gate connected to the ground voltage VSS.

Next, the operation will be described.

The fundamental operation of the voltage level conversion circuit 103 according to the third embodiment is identical to that of the first embodiment.

In this third embodiment, however, since the resistor R1 is inserted between the first connection node N11 and the first P channel MOS transistor Qlp1 and the resistor R2 is inserted between the second connection node N12 and the second P channel MOS transistor Qlp2, the abilities of the P channel MOS transistors to drive the connection nodes N11 and N12 are suppressed. Therefore, the effects of driving the connection nodes N11 and N12 by the N channel MOS transistors Qhn1 and Qhn2 are substantially improved.

As described above, according to the third embodiment, as in the first embodiment, the VDD1 system signal having the logical voltage level corresponding to the high power supply voltage VDD1 is input to only the high breakdown voltage transistors Qhn1 and Qhn2 while the VDD2 system signal having the logical voltage level corresponding to the low power supply voltage VDD2 is input to the low breakdown voltage transistors Qlp1 and Qlp2 and the NOT circuit 30, and therefore, low breakdown voltage transistors having a low threshold value can be used as the VDD2 system transistors Qlp1 and Qlp2 constituting the level converter 103a and the transistor constituting the NOT circuit 30. Thereby, the low power supply voltage VDD2 as the VDD2 system power supply voltage can be made lower than the threshold value of the VDD1 system high breakdown voltage transistor, resulting in further reduction in the low power supply voltage VDD2.

Further, since the resistors are connected in series to the power supply side P channel transistors Qlp1 and Qlp2 constituting the level converter 103a to suppress the driving abilities of these transistors, the driving efficiencies of the ground side N channel transistors Qhn1 and Qhn2 are substantially increased, whereby the ground voltage level of the signal outputted from the NOT circuit 30 can be speedily decided.

Embodiment 4

Figure 4:
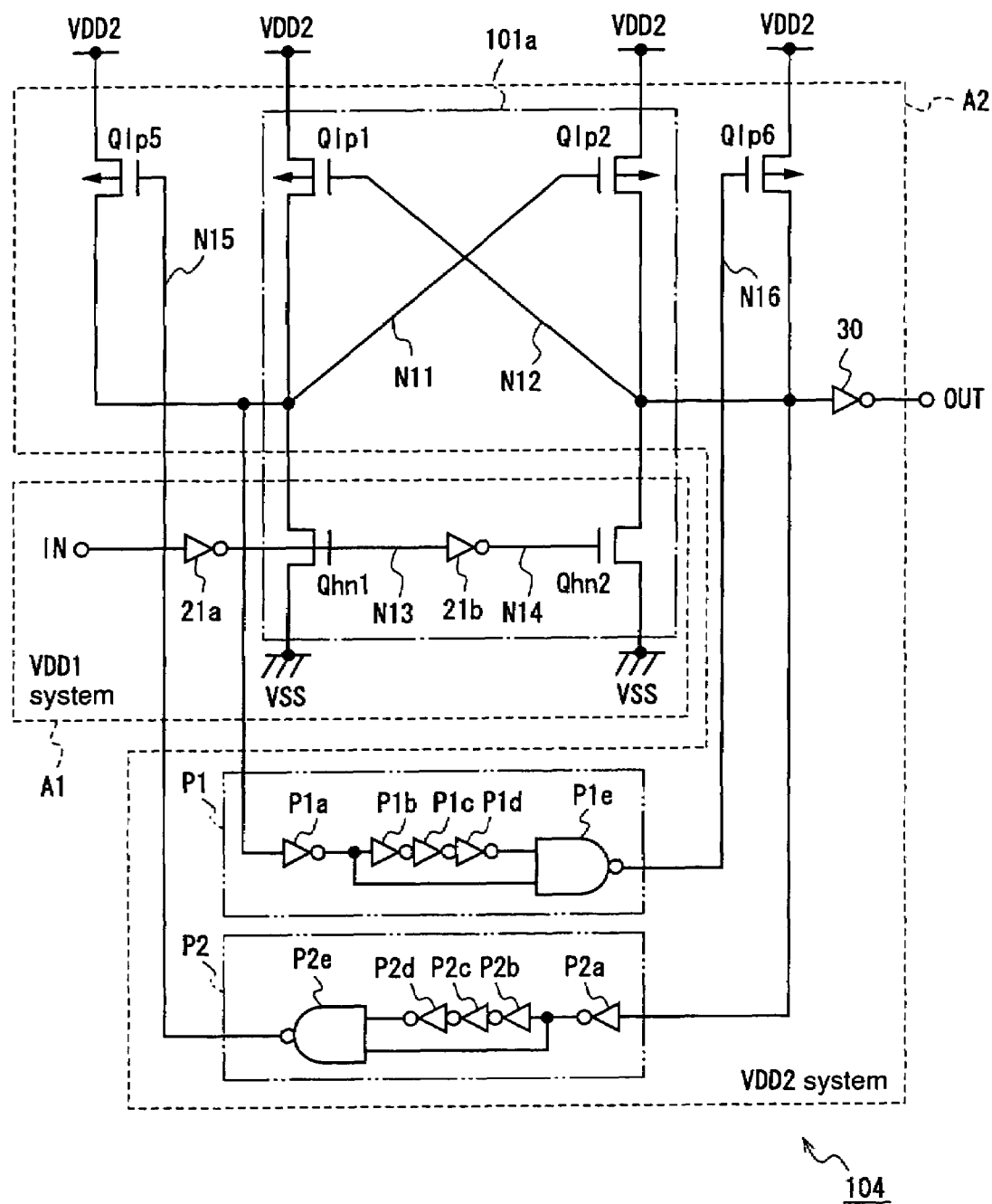
FIG. 4 is a diagram for explaining a voltage level conversion circuit according to a fourth embodiment of the present invention.

FIG. 4 is a circuit diagram for explaining a voltage level conversion circuit according to a fourth embodiment of the present invention.

A voltage level conversion circuit 104 according to the fourth embodiment is provided with a circuit structure for supporting the operation of the power supply side transistors Qlp1 and Qlp2 of the level converter 101a, in addition to the voltage level conversion circuit 101 according to the first embodiment.

With reference to FIG. 4, the voltage level conversion circuit 104 includes a level converter 101a for converting an input signal having a logical voltage level of a high power supply voltage system (VDD1 system) into an output signal having a logical voltage level of a low power supply voltage system (VDD2 system) and outputting the level-converted signal, and a NOT circuit 30 for inverting the level-converted signal and outputting the inverted signal.

Further, the voltage level conversion circuit 104 includes a fifth P channel MOS transistor Qlp5 which is connected in parallel to the power supply side P channel MOS transistor Qlp1 of the level converter 101a and supports the operation of the transistor Qlp1 to charge the connection node N11, a sixth P channel MOS transistor Qlp6 which is connected in parallel to the power supply side P channel MOS transistor Qlp2 of the level converter 101a and supports the operation of the transistor Qlp2 to charge the connection node N12, and first and second pulse signal generation circuits P1 and P2 for driving these auxiliary transistors Qlp5 and Qlp6 with pulse signals, respectively.

The pulse signal generation circuit P1 for driving the transistor Qlp6 comprises four stages of NOT circuits P1a to P1d for successively inverting the voltage level of the connection node N11 of the level converter 101a, and a two-input NAND circuit P1e to which the output of the first-stage NOT circuit P1a and the output of the fourth-stage NOT circuit P1d are input, respectively, wherein an output node N16 of the two-input NAND circuit P1e is connected to the gate of the P channel MOS transistor Qlp6.

Furthermore, the pulse signal generation circuit P2 for driving the transistor Qlp5 comprises four stages of NOT circuits P2a to P2d for successively inverting the voltage level of the connection node N12 of the level converter 101a, and a two-input NAND circuit P2e to which the output of the first-stage NOT circuit P2a and the output of the fourth-stage NOT circuit P2d are input, respectively, wherein an output node N15 of the two-input NAND circuit P2e is connected to the gate of the P channel MOS transistor Qlp5.

The auxiliary transistors Qlp5 and Qlp6 and the transistors constituting the pulse signal generation circuits P1 and P2 are low breakdown voltage transistors having a low threshold value, and these transistors belong to a circuit system (VDD2 system) driven by the low power supply voltage VDD2.

Next, the operation will be described.

When a VDD1 system input signal IN is input to the voltage level conversion circuit 104, the input signal IN is inverted by the NOT circuit 21a, and a NOT signal of the input signal IN is input to the gate of the first N channel MOS transistor Qhn1 and to the NOT circuit 21b. The NOT signal of the input signal IN is inverted by the NOT circuit 21b and input to the gate of the second N channel MOS transistor Qhn2.

For example, when the voltage of the input signal IN is the L level logical voltage (=VSS), the gate voltage of the first N channel transistor Qhn1 is the H level logical voltage (=VDD1) while the gate voltage of the second N channel transistor Qhn2 is the L level logical voltage (=VSS), and the N channel transistor Qhn1 is turned on while the N channel transistor Qhn2 is turned off.

Then, the voltage of the first connection node N11 becomes the L level logical voltage (=VSS), and the second P channel MOS transistor Qlp2 is turned on and starts charging of the second connection node N12. At this time, the voltage of the first connection node N11 is input to the first pulse generation circuit P1, and a one shot pulse signal outputted from the pulse generation circuit P1 and having a pulse width according to the number of the stages of the NOT circuits P1a to P1d is applied to the gate of the P channel MOS transistor Qlp6, whereby the transistor Qlp6 starts charging of the second connection node N12. Thereby, the operation of the second P channel MOS transistor Qlp2 is supported by the P channel MOS transistor Qlp6.

Furthermore, since the voltage of the second connection node N12 is the gate voltage of the first P channel MOS transistor Qlp1, the transistor Qlp1 is in the off state, and the voltage of the first connection node N11 is decided at the L level logical voltage (=VSS).

On the other hand, when the voltage of the input signal IN is the H level logical voltage (=VDD1), the gate voltage of the first N channel transistor Qhn1 becomes the L level logical voltage (=VSS) while the gate voltage of the second N channel transistor Qhn2 is the H level logical voltage (=VDD1), and thereby the N channel transistor Qhn1 is turned off while the N channel transistor Qhn2 is turned on.

Then, the voltage of the second connection node N12 becomes the L level logical voltage (=VSS), whereby the first P channel MOS transistor Qlp1 is turned on and starts charging of the first connection node N11. At this time, the voltage of the second connection node N12 is input to the second pulse signal generation circuit P2, and a one shot pulse signal outputted from the pulse generation circuit P2 and having a pulse width according to the number of the stages of the NOT circuits P2a to P2d is applied to the gate of the P channel MOS transistor Qlp5, whereby the transistor Qlp5 starts charging of the first connection node N11. Thereby, the operation of the first P channel MOS transistor Qlp1 is supported by the P channel MOS transistor Qlp5.

Furthermore, since the voltage of the first connection node N11 is the gate voltage of the second P channel MOS transistor Qlp2, the transistor Qlp2 is in the off state, and the voltage of the second connection node N12 is decided at the L level logical voltage (=VSS).

Then, the logical voltage of the second connection node N12 is inverted by the NOT circuit 30 that is driven by the low power supply voltage VDD2, and the inverted output from the NOT circuit 30 is output to the VDD2 system circuit as an output signal OUT of the voltage level conversion circuit 104.

As described above, according to the fourth embodiment, as in the first embodiment, the VDD1 system signal having the logical voltage level corresponding to the high power supply voltage VDD1 is input to only the high breakdown voltage transistors Qhn1 and Qhn2, and the VDD2 system signal having the logical voltage level corresponding to the low power supply voltage VDD2 is input to the low breakdown voltage transistors Qlp1 and Qlp2 and the NOT circuit 30. Therefore, low breakdown voltage transistors having a low threshold value can be used as the VDD2 system transistors Qlp1 and Qlp2 constituting the level converter 101a and the transistor constituting the NOT circuit 30, whereby the low power supply voltage VDD2 as the VDD2 system power supply voltage can be made lower than the threshold value of the VDD1 system high breakdown voltage transistor, resulting in further reduction in the low power supply voltage VDD2.

Further, the voltage level conversion circuit according to the fourth embodiment is provided with the P channel transistor Qlp5 that supports the operation of the power supply side P channel transistor Qlp1 of the level converter 101a to charge the connection node N11, and the P channel transistor Qlp6 that supports the operation of the power supply side P channel transistor Qlp2 of the level converter 101a to charge the connection node N12, and these auxiliary transistors Qlp5 and Qlp6 are driven by one-shot pulse signals outputted from the pulse signal generation circuits P1 and P2, resulting in a voltage level conversion circuit capable of more stable high-speed operation as compared with the first embodiment.

Embodiment 5

Figure 5:
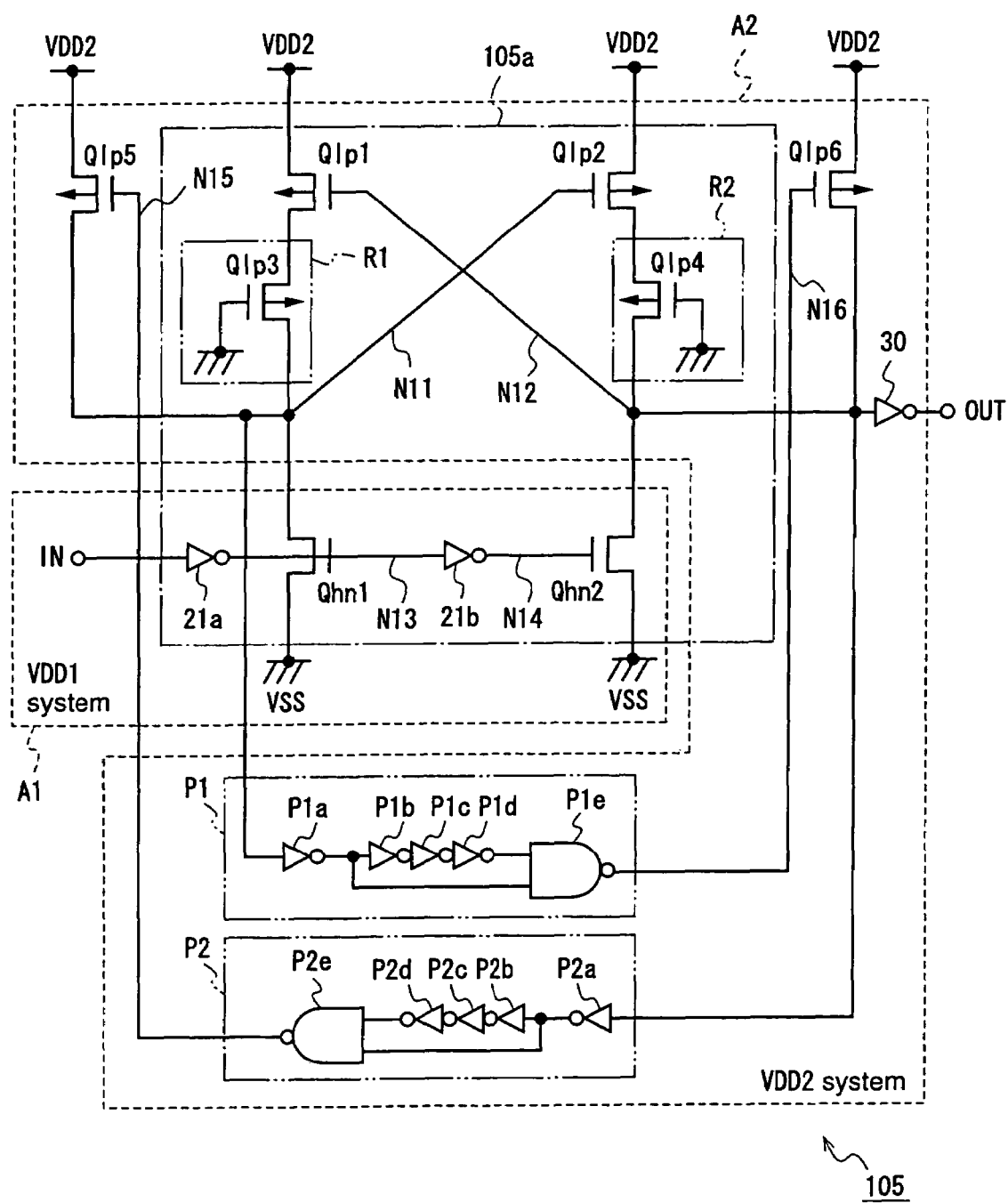
FIG. 5 is a diagram for explaining a voltage level conversion circuit according to a fifth embodiment of the present invention.
Figure 6:
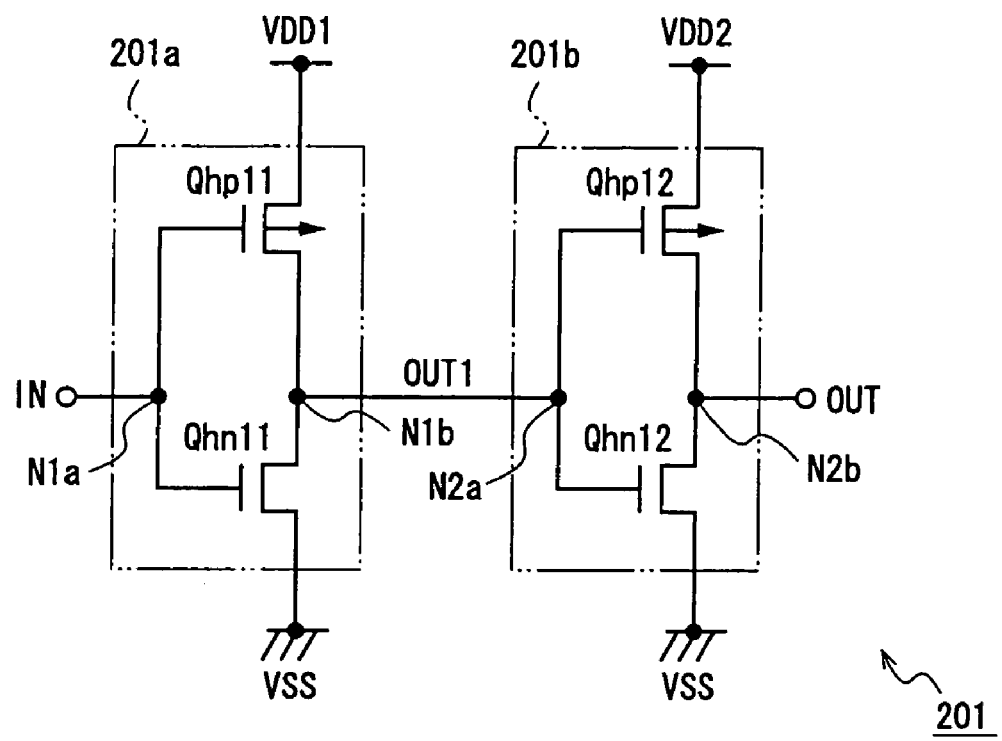
FIG. 6 is a diagram for explaining the conventional voltage level conversion circuit.

FIG. 5 is a circuit diagram for explaining a voltage level conversion circuit according to a fifth embodiment of the present invention.

A voltage level conversion circuit 105 according to the fifth embodiment is provided with a level converter 105a of the same construction as the level converter 103a of the third embodiment, instead of the level converter 101a of the voltage level conversion circuit according to the fourth embodiment. In other words, the voltage level conversion circuit 105 of this fifth embodiment has a circuit structure obtained by combining the third embodiment and the fourth embodiment.

In the level converter 105a of the voltage level conversion circuit according to the fifth embodiment, a resistor R1 is inserted between the first connection node N11 and the first P channel MOS transistor Qlp1 in the level converter 101a according to the fourth embodiment, and a resistor R2 is inserted between the second connection node N12 and the second P channel MOS transistor Qlp2 in the level converter 101a.

The resistor R1 comprises a P channel MOS transistor Qlp3 which is connected in series between the first connection node N11 and the first P channel MOS transistor Qlp1, and has a gate connected to the ground voltage VSS. Further, the resistor R2 comprises a P channel MOS transistor Qlp4 which is connected in series between the second connection node N12 and the second P channel MOS transistor Qlp2, and has a gate connected to the ground voltage VSS.

Next, the operation will be described.

The fundamental operation of the voltage level conversion circuit 105 according to the fifth embodiment is identical to that of the fourth embodiment.

In this fifth embodiment, however, since the resistor R1 is inserted between the first connection node N11 and the first P channel MOS transistor Qlp1 and the resistor R2 is inserted between the second connection node N12 and the second P channel MOS transistor Qlp2, the abilities of the P channel MOS transistors to drive the connection nodes N11 and N12 are suppressed, and thereby the effects of driving the connection nodes N11 and N12 by the N channel MOS transistors Qhn1 and Qhn2 are substantially improved.

As described above, according to the fifth embodiment, as in the first embodiment, the VDD1 system signal having the logical voltage level corresponding to the high power supply voltage VDD1 is input to only the high breakdown voltage transistors Qhn1 and Qhn2 while the VDD2 system signal having the logical voltage level corresponding to the low power supply voltage VDD2 is input to the low breakdown voltage transistors Qlp1 and Qlp2 and the NOT circuit 30, and therefore, low breakdown voltage transistors having a low threshold value can be used as the VDD2 system transistors Qlp1 and Qlp2 constituting the level converter 105a and the transistor constituting the NOT circuit 30. Thereby, the low power supply voltage VDD2 as the VDD2 system power supply voltage can be made lower than the threshold value of the VDD1 system high breakdown voltage transistor, resulting in further reduction in the low power supply voltage VDD2.

Further, in this fifth embodiment, as in the third embodiment, since the resistors are connected in series to the power supply side P channel MOS transistors Qlp1 and Qlp2 constituting the level converter 105a to suppress the driving abilities of these transistors, the driving efficiencies of the ground side N channel transistors Qhn1 and Qhn2 are substantially improved, whereby the ground voltage level of the signal outputted from the NOT circuit 30 can be speedily decided.

Further, in this fifth embodiment, as in the fourth embodiment, the P channel transistor Qlp5 supports the operation of the power supply side P channel transistor Qlp1 of the level converter 105a to charge the connection node N11, and the P channel transistor Qlp6 supports the operation of the power supply side P channel transistor Qlp2 of the level converter 105a to charge the connection node N12, resulting in a voltage level conversion circuit capable of more stable high-speed operation as compared with the first embodiment.

APPLICABILITY IN INDUSTRY

A voltage level conversion circuit according to the present invention realizes an operation with a lower internal voltage in a circuit for converting a logical voltage level from a logical voltage level corresponding to a high power supply voltage to a logical voltage level corresponding to a low power supply voltage, and it is useful in reducing the low power supply voltage that drives the voltage level conversion circuit.

What is claimed is:

1. A voltage level conversion circuit for converting an input signal having a logical voltage level corresponding to a first power supply voltage into an output signal having a logical voltage level corresponding to a second power supply voltage that is lower than the first power supply voltage, said voltage level conversion circuit being for use with a circuit that is to be driven by the second power supply voltage, said voltage level conversion circuit comprising:
   a first P channel MOS transistor, having the second power supply voltage as a breakdown voltage, and a first N channel MOS transistor, having the first power supply voltage as a breakdown voltage, connected in series between the second power supply voltage and a ground voltage;
   a second P channel MOS transistor, having the second power supply voltage as a breakdown voltage, and a second N channel MOS transistor having the first power supply voltage as a breakdown voltage, connected in series between the second power supply voltage and the ground voltage;
   a first connection node, between the first P channel MOS transistor and the first N channel MOS transistor, connected to a gate of the second P channel MOS transistor; and
   a second connection node, between the second P channel MOS transistor and the second N channel MOS transistor, connected to a gate of the first P channel MOS transistor;
   wherein said output signal is to be supplied via the second connection node to the circuit that is to be driven by the second power supply voltage;
   the driving abilities of the first P channel MOS transistor and the second P channel MOS transistor are smaller than the driving abilities of the first N channel MOS transistor and the second N channel MOS transistor; and
   the voltage level conversion circuit further comprising:
   a first resistor connected between the first P channel MOS transistor and the first connection node; and
   a second resistor connected between the second P channel MOS transistor and the second connection node.

2. A voltage level conversion circuit for converting an input signal having a logical voltage level corresponding to a first power supply voltage into an output signal having a logical voltage level corresponding to a second power supply voltage that is lower than the first power supply voltage, said voltage level conversion circuit being for use with a circuit that is to be driven by the second power supply voltage, said voltage level conversion circuit comprising:
   a first P channel MOS transistor, having the second power supply voltage as a breakdown voltage, and a first N channel MOS transistor, having the first power supply voltage as a breakdown voltage, connected in series between the second power supply voltage and a ground voltage;
   a second P channel MOS transistor, having the second power supply voltage as a breakdown voltage, and a second N channel MOS transistor having the first power supply voltage as a breakdown voltage, connected in series between the second power supply voltage and the ground voltage;
   a first connection node, between the first P channel MOS transistor and the first N channel MOS transistor, connected to a gate of the second P channel MOS transistor;
   a second connection node, between the second P channel MOS transistor and the second N channel MOS transistor, connected to a gate of the first P channel MOS transistor;
   a fifth P channel MOS transistor connected between the first connection node and the second power supply voltage;
   a sixth P channel MOS transistor connected between the second connection node and the second power supply voltage;
   a first signal generation circuit for applying a one-shot pulse voltage for turning on the sixth P channel MOS transistor to a gate of the sixth P channel MOS transistor, when an L level logical voltage generated at the first connection node is detected; and
   a second signal generation circuit for applying a one-shot pulse voltage for turning on the fifth P channel MOS transistor to a gate of the fifth P channel MOS transistor, when an L level logical voltage generated at the second connection node is detected;
   wherein said output signal is to be supplied via the second connection node to the circuit that is to be driven by the second power supply voltage.

3. A voltage level conversion circuit as defined in claim 2 further comprising:
   a first resistor connected between the first P channel MOS transistor and the first connection node; and
   a second resistor connected between the second P channel MOS transistor and the second connection node.

4. A voltage level conversion circuit for converting an input signal having a logical voltage level corresponding to a first power supply voltage into an output signal having a logical voltage level corresponding to a second power supply voltage that is lower than the first power supply voltage, said voltage level conversion circuit being for use with a circuit that is to be driven by the second power supply voltage, said voltage level conversion circuit comprising:
   a first P channel MOS transistor, having the second power supply voltage as a breakdown voltage, and a first N channel MOS transistor, having the first power supply voltage as a breakdown voltage, connected in series between the second power supply voltage and a ground voltage;

a second P channel MOS transistor, having the second power supply voltage as a breakdown voltage, and a second N channel MOS transistor having the first power supply voltage as a breakdown voltage, connected in series between the second power supply voltage and the ground voltage;

a first connection node, between the first P channel MOS transistor and the first N channel MOS transistor, connected to a gate of the second P channel MOS transistor; and a second connection node, between the second P channel MOS transistor and the second N channel MOS transistor, connected to a gate of the first P channel MOS transistor;

wherein said output signal is to be supplied via the second connection node to the circuit that is to be driven by the second power supply voltage;

the driving abilities of the first P channel MOS transistor and the second P channel MOS transistor are smaller than the driving abilities of the first N channel MOS transistor and the second N channel MOS transistor; and the voltage level conversion circuit further comprises:

a fifth P channel MOS transistor connected between the first connection node and the second power supply voltage;

a sixth P channel MOS transistor connected between the second connection node and the second power supply voltage;

a first signal generation circuit for applying a one-shot pulse voltage for turning on the sixth P channel MOS transistor to a gate of the sixth P channel MOS transistor, when an L level logical voltage generated at the first connection node is detected; and a second signal generation circuit for applying a one-shot pulse voltage for turning on the fifth P channel MOS transistor to a gate of the fifth P channel MOS transistor, when an L level logical voltage generated at the second connection node is detected.

5. A voltage level conversion circuit as defined in claim 4 further comprising:

a first resistor connected between the first P channel MOS transistor and the first connection node; and a second resistor connected between the second P channel MOS transistor and the second connection node.

* * * * *